US012215934B2

(12) United States Patent
Lin et al.

(10) Patent No.: US 12,215,934 B2
(45) Date of Patent: Feb. 4, 2025

(54) THERMAL MODULE STRUCTURE

(71) Applicant: ASIA VITAL COMPONENTS CO., LTD., New Taipei (TW)

(72) Inventors: Sheng-Huang Lin, New Taipei (TW); Yuan-Yi Lin, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 308 days.

(21) Appl. No.: 18/064,291

(22) Filed: Dec. 12, 2022

(65) Prior Publication Data

US 2023/0243608 A1 Aug. 3, 2023

(30) Foreign Application Priority Data

Jan. 28, 2022 (TW) .................................. 111103915

(51) Int. Cl.
*F28F 21/08* (2006.01)
*F28F 1/32* (2006.01)
*H05K 7/20* (2006.01)

(52) U.S. Cl.
CPC ............ *F28F 21/089* (2013.01); *F28F 1/325* (2013.01); *H05K 7/20336* (2013.01); *F28F 2275/06* (2013.01)

(58) Field of Classification Search
CPC ...... F28F 21/089; F28F 1/325; F28F 2275/06; H05K 7/20336

(Continued)

(56) References Cited

U.S. PATENT DOCUMENTS 6,625,021 B1 * 9/2003 Lofland ................ H01L 23/427
361/720
6,779,595 B1 * 8/2004 Chiang ................ H01L 23/467
165/185

(Continued)

FOREIGN PATENT DOCUMENTS

CN 202485510 U 10/2012
CN 209326431 U 8/2019

(Continued)

OTHER PUBLICATIONS

Search Report dated Nov. 7, 2022 issued by Taiwan Intellectual Property Office for counterpart application No. 111103915.

*Primary Examiner* — Claire E Rojohn, III
(74) *Attorney, Agent, or Firm* — Demian K. Jackson; Jackson IPG PLLC

(57) ABSTRACT

A thermal module structure includes an aluminum base having an upper and a lower surface, at least one L-shaped copper heat pipe, a first aluminum fin assembly, a second aluminum fin assembly, and at least one copper embedding layer. The copper heat pipe includes a heat absorption section fitted on the aluminum base, and a heat dissipation section connected to the second aluminum fin assembly. The copper embedding layers are provided on the aluminum base at areas corresponding to the first aluminum fin assembly and the heat absorption section of the copper heat pipe, and on a bottom surface of the first aluminum fin assembly that is to be connected to the aluminum base. Thus, the first aluminum fin assembly and the copper heat pipe can be directly welded to the aluminum base via the copper embedding layers without the need of electroless nickel plating.

7 Claims, 4 Drawing Sheets

(58) Field of Classification Search
USPC .................................................. 165/104.21
See application file for complete search history.

(56) References Cited

U.S. PATENT DOCUMENTS

| | | | | | |
|---|---|---|---|---|---|
| 6,830,098 | B1* | 12/2004 | Todd | ................... | F28D 15/0275 |
| | | | | | 165/104.21 |
| 6,894,900 | B2* | 5/2005 | Malone | ................. | H01L 23/427 |
| | | | | | 174/15.2 |
| 7,143,819 | B2* | 12/2006 | Malone | .............. | F28D 15/0275 |
| | | | | | 165/104.33 |
| 7,188,663 | B2* | 3/2007 | Lin | ....................... | H01L 23/427 |
| | | | | | 165/104.33 |
| 7,387,155 | B2* | 6/2008 | Chen | .................... | H01L 23/467 |
| | | | | | 257/E23.099 |
| 7,455,102 | B2* | 11/2008 | Cheng | ............... | F28D 15/0275 |
| | | | | | 257/E23.099 |
| 7,942,194 | B2* | 5/2011 | Mochizuki | ............ | H01L 23/427 |
| | | | | | 165/104.21 |
| 8,011,815 | B2* | 9/2011 | Zhou | ...................... | F21V 29/75 |
| | | | | | 362/373 |
| 8,191,612 | B2* | 6/2012 | Huang | ................. | H01L 23/427 |
| | | | | | 165/104.21 |
| 8,220,151 | B2* | 7/2012 | Yang | ....................... | B23P 15/26 |
| | | | | | 29/890.032 |
| 8,267,157 | B2* | 9/2012 | Qin | ..................... | F28D 15/0275 |
| | | | | | 165/104.33 |
| 8,322,403 | B2* | 12/2012 | Lin | .................... | F28D 15/0275 |
| | | | | | 165/80.2 |
| 8,746,325 | B2* | 6/2014 | Huang | ............... | F28D 15/0233 |
| | | | | | 165/80.2 |
| 8,806,748 | B2* | 8/2014 | Huang | ................... | F28F 9/013 |
| | | | | | 29/890.038 |
| 9,795,056 | B2* | 10/2017 | Teraki | .................. | H01L 23/473 |
| 10,108,237 | B1* | 10/2018 | Fu | ....................... | F28D 15/0275 |
| 10,739,832 | B2* | 8/2020 | O'Connell | ............ | H01L 23/467 |
| 10,772,235 | B2* | 9/2020 | Wei | ...................... | F28F 21/084 |
| 12,146,714 | B2* | 11/2024 | Lin | ................... | H05K 7/20418 |
| 2006/0278374 | A1* | 12/2006 | Hao | ................... | F28D 15/0266 |
| | | | | | 257/E23.099 |
| 2007/0217153 | A1* | 9/2007 | Lai | ....................... | H01L 23/427 |
| | | | | | 165/80.4 |
| 2009/0266522 | A1* | 10/2009 | Lin | ....................... | H01L 23/427 |
| | | | | | 29/890.032 |
| 2012/0205084 | A1* | 8/2012 | Huang | .................. | H01L 23/427 |
| | | | | | 165/181 |
| 2012/0222839 | A1* | 9/2012 | Huang | ................ | F28D 15/0275 |
| | | | | | 165/104.26 |
| 2016/0150672 | A1* | 5/2016 | Lin | ......................... | F28F 13/00 |
| | | | | | 165/185 |
| 2017/0080533 | A1* | 3/2017 | Lin | ......................... | B23P 15/26 |
| 2017/0102186 | A1* | 4/2017 | Huang | ................ | F28D 15/0275 |
| 2021/0123687 | A1* | 4/2021 | Lin | .................... | H05K 7/20336 |
| 2021/0398871 | A1* | 12/2021 | Eid | ....................... | H01L 23/3736 |
| 2021/0410331 | A1* | 12/2021 | Eid | .................... | F28D 15/0275 |
| 2022/0346266 | A1* | 10/2022 | Lin | ..................... | H05K 7/2039 |
| 2022/0346276 | A1* | 10/2022 | Lin | .................... | H05K 7/20327 |
| 2023/0241728 | A1* | 8/2023 | Lin | ......................... | B23P 15/26 |
| | | | | | 29/890.054 |
| 2023/0243594 | A1* | 8/2023 | Chen | ................... | F28D 15/0233 |
| | | | | | 165/104.21 |
| 2023/0243595 | A1* | 8/2023 | Lin | ......................... | F28F 9/268 |
| | | | | | 165/104.21 |
| 2023/0243596 | A1* | 8/2023 | Lin | ...................... | F28F 21/085 |
| | | | | | 165/104.21 |
| 2023/0243598 | A1* | 8/2023 | Lin | ...................... | F28F 21/084 |
| | | | | | 165/104.26 |
| 2023/0243603 | A1* | 8/2023 | Lin | .................... | F28D 15/0275 |
| | | | | | 165/181 |
| 2023/0243607 | A1* | 8/2023 | Lin | ..................... | H01L 21/4882 |
| | | | | | 165/104.21 |
| 2023/0243608 | A1* | 8/2023 | Lin | .................... | F28D 15/0275 |
| | | | | | 165/104.21 |
| 2024/0093946 | A1* | 3/2024 | Lin | ........................... | F28F 1/32 |
| 2024/0162108 | A1* | 5/2024 | Lin | ................... | H01L 23/3672 |

FOREIGN PATENT DOCUMENTS

| | | |
|---|---|---|
| TW | 200725233 A | 7/2007 |
| TW | 201038911 A | 11/2010 |
| TW | 201248106 A | 12/2012 |
| TW | M629434 U | 7/2022 |

* cited by examiner

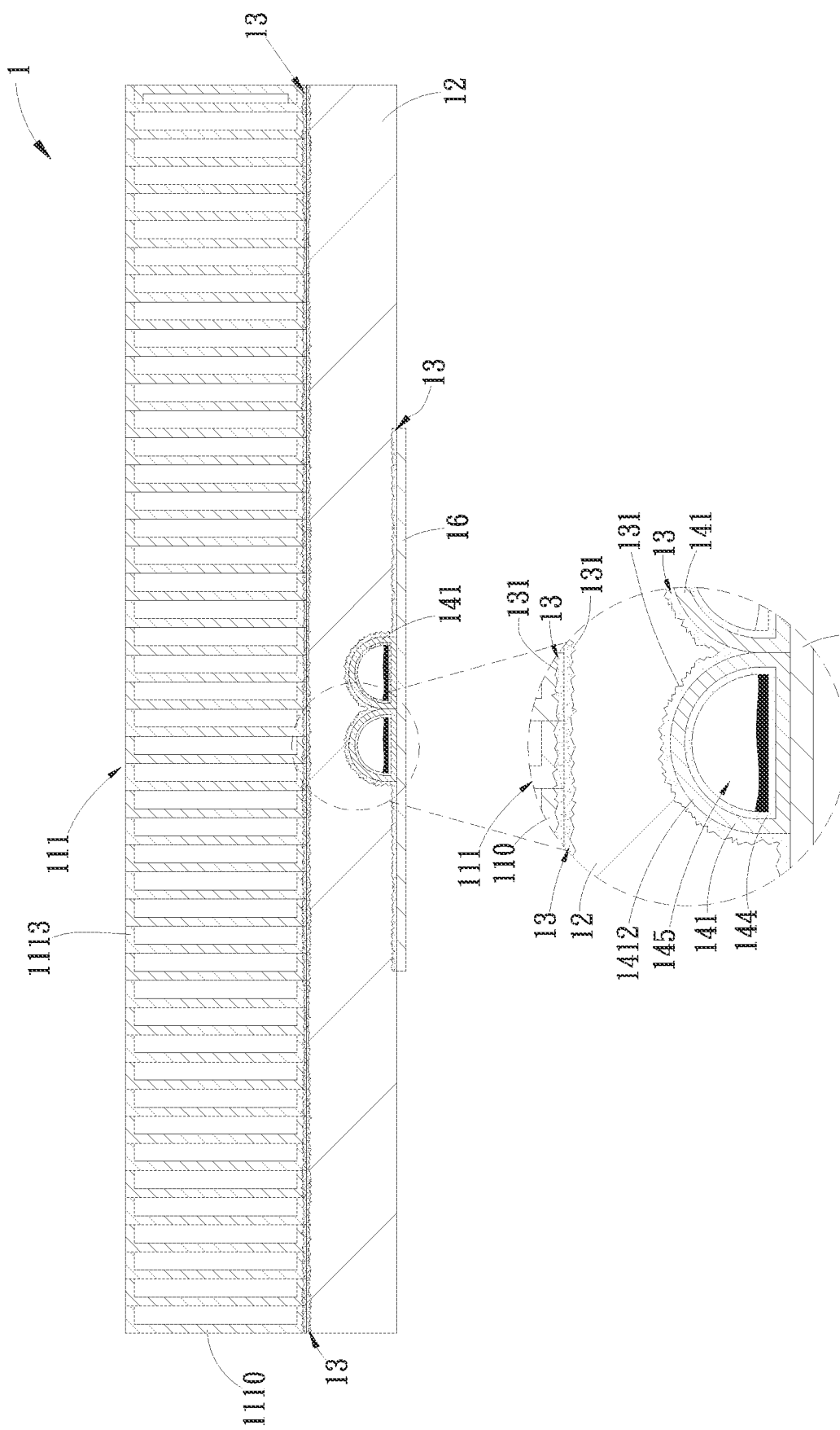

THERMAL MODULE STRUCTURE

This application claims the priority benefit of Taiwan patent application number 111103915 filed on Jan. 28, 2022.

FIELD OF THE INVENTION

The present invention relates to a thermal module structure, and more particularly, to a thermal module structure that has copper embedding layers provided at areas for connecting an aluminum base to an aluminum fin assembly and a copper heat pipe, such that the aluminum fin assembly and the copper heat pipe made of dissimilar metal materials all can be directly connected to the aluminum base by welding without the need of electroless nickel plating.

BACKGROUND OF THE INVENTION

Conventionally, heat sink or heat dissipation device is usually made of a copper metal material and an aluminum metal material in combination. Since copper metal material has the feature of high efficiency of heat conduction, it is often selected for making a heat dissipation base of the heat sink or the heat dissipation device to exchange heat with heat-producing execution units, including the central processing unit, the graphics processing unit, and other chips or heat sources. However, heat sink or heat dissipation device completely made of copper would be very heavy in weight and expensive in cost. Therefore, in the currently adopted manufacturing methods, only the parts in direct contact with the heat sources to absorb produced heat, such as heat transfer units (or elements, blocks and bases), copper plates, heat pipes and thermal chambers, are made of copper. As to other parts like snap-on fin assemblies, radiators and heat dissipation base, they are made of aluminum, which is relatively lighter in weight and lower in cost, in order to reduce overall weight and manufacturing cost of the heat sink or heat dissipation device.

For example, the commonly available heat dissipation device generally includes an aluminum base, a plurality of copper heat pipes, a snap-on aluminum fin assembly, and a copper plate. The aluminum snap-on fin assembly includes a plurality of fins that are fastened to one another by snap fitting. Each of the fins includes two bent edges, and each bent edge has an outward projected fastening section. The fastening sections on the fins are connected to one another, such that the bent edges of the fins together form a top and a bottom surface of the aluminum snap-on fin assembly. The bottom surface of the aluminum fin assembly is set on an upper surface of the aluminum base. The copper heat pipes respectively have a heat absorption end received in a groove sunken into a lower surface of the aluminum base, and a heat dissipation end extended from the heat absorption end to extend through and assembled to another snap-on aluminum fin assembly. And, the copper plate is covered on the lower surface of the aluminum base for contacting with a heat source.

The aluminum surfaces of the aluminum base tend to oxidize and will produce aluminum oxide ($Al_2O_3$) during the welding process. The aluminum oxide has a high melting point, which would directly hinder bonding of the aluminum metal material to the copper metal material through melting and brings difficulties to the welding process. More specifically, when directly welding the copper metal material to the aluminum metal material, areas of the two metal materials subjected to direct welding will become brittle to form cracks. Further, in the process of welding the copper metal material to the aluminum metal material, one side the welding joint located closer to the copper metal material tends to form copper aluminide ($CuAl_2$) eutectic, which is distributed in the vicinity of grain boundaries to easily cause the problem of fatigue crack propagation through grain boundaries. Besides, copper and aluminum metal materials are quite different in their melting points and eutectic temperatures. When the surface of the aluminum metal material has fully molten in the welding operation, the copper metal material is still in a solid phase. On the other hand, when the copper metal material is molten, the aluminum metal material has long been molten and could not co-exist with the molten copper metal material in the eutectic state to cause largely increased difficulties in welding the copper metal material to the aluminum metal material. Further, since air pores are easily formed at the welding joint and since the copper metal material and the aluminum metal material all have good heat conductivity, the metal in the weld pool crystallizes quickly, which prevents the reaction gas used in pyrometallurgy from timely escaping from the weld pool to form air pores easily. Owing to these problems, the aluminum base and the copper heat pipes and/or the copper plate could not be directly welded together at the contact areas between them.

To solve the above problem that the copper metal material and the aluminum metal material are not weldable to each other directly and other problems derived therefrom, related manufacturers developed a solution by modifying the surfaces of the aluminum base and the copper heat pipes and/or the copper plate that are to be connected together to facilitate subsequent dissimilar metal welding. In other words, the lower surface of the aluminum base and the inner surface or the connection surfaces of the grooves on the lower surface of the aluminum base are respectively formed with an electroless nickel plating layer prior to welding. With the electroless nickel plating layers, the two dissimilar metal materials, i.e. the aluminum metal material and the copper metal material, can be welded to one another. Currently, the electroless nickel plating is adopted by persons skilled in the art as the technical means of metal surface modification, because it provides special sediment properties, including the evenness of the sediment deposited in deep recess, holes and blind holes. The electroless nickel plating is also referred to as chemical deposition or autocatalytic plating, and can be classified by phosphorus content into three types, i.e. low, middle and high phosphorus electroless nickel plating. The electroless nickel plating is particularly different from the electro nickel plating in that it is performed in a working environment without electric current and uses the reducing agent in a solution to reduce metal ions. Prior to the electroless nickel plating, a specimen surface must be catalyzed.

While the surface modification solves the problem of welding the aluminum base to the copper heat pipes and the copper plate, it disadvantageously causes problems in environmental protection and other related fields. This is because electroless nickel plating is a chemical process that requires a large quantity of chemical reaction liquid and produces a large amount of industrial liquid waste containing heavy metals or chemical substances after the process. Industrial liquid waste generates a large amount of wastewater that contains toxicants, such as yellow phosphorus. In the case of yellow phosphorus containing wastewater, the concentration of yellow phosphorus thereof reaches 50~390 mg/L. Yellow phosphorus is highly toxic, and its existence in human body would badly endanger liver and other organs. Drinking phosphorus-containing water for a long time would result in osteoporosis to cause different diseases, such as mandible necrosis. Currently, in awareness of the dangers caused by yellow phosphorus to people's living environment, many countries in the world have forbidden the use of electroless nickel plating, and non-toxic chemical processes are actively developed to ensure environmental protection. Further, owing to the recently unstable global supply chains, nickel, the raw material for electroless nickel plating is in serious shortage, which also leads to increased overall cost of electroless nickel plating.

Therefore, it is desirable to find a way for welding dissimilar metal parts of the heat sink or the heat dissipation device to one another without the need of any conventional surface modification processing.

SUMMARY OF THE INVENTION

A primary object of the present invention is to provide a thermal module structure, which has copper embedding layers provided on an aluminum base and other parts at areas to be connected with one another, such that either copper heat pipes and the aluminum base made of dissimilar metal materials or an aluminum fin assembly and the aluminum base made of the same metal material can be connected together directly by welding without any surface modification in advance. This effectively reduces manufacturing cost and realizes the purpose of environmental protection.

To achieve the above and other objects, the thermal module structure provided according to the present invention includes an aluminum base, at least one copper heat pipe, a first aluminum fin assembly, a second aluminum fin assembly, and at least one copper embedding layer. The aluminum base has an upper surface, a lower surface, and at least one receiving section. The copper heat pipe includes a horizontally extended heat absorption section, a vertically extended heat dissipation section, and a substantially right-angled intermediate section. The intermediate section is connected at two ends to the heat absorption section and the heat dissipation section to give the copper heat pipe a substantially L-shaped configuration; and the heat absorption section is fitted in the receiving section of the aluminum base. The first aluminum fin assembly includes a plurality of first fins integrally formed with or additionally provided on the upper surface of the aluminum base. Any two adjacent first fins together define a first air flow passage between them, and the first air flow passages are oriented perpendicular to the upper surface of the aluminum base. The second aluminum fin assembly includes a plurality of second fins that are sequentially fastened to one another. Every second fin is provided with at least one through hole to extend through the second fin in a thickness direction thereof for the heat dissipation section of the copper heat pipe to extend therethrough. Any two adjacent second fins together define a second air flow passage between them; and the second air flow passages are oriented parallel to the upper surface of the aluminum base to allow air flows in a direction perpendicular to the first air flow passage to flow through the second air flow passages. The copper embedding layers are provided on the upper surface and in the receiving section of the aluminum base and on a bottom surface of the first aluminum fin assembly.

The upper surface of the aluminum base and the bottom surface of the first aluminum fin assembly are connected to each other via the copper embedding layers, and the receiving section of the aluminum base and the heat absorption section of the copper heat pipe are also connected to one another via the copper embedding layers.

In the present invention, with the provision of the copper embedding layers on the aluminum base, the copper heat pipes and the first aluminum fin assembly at areas that are to be connected with one another, it is possible to directly weld the aluminum base to the copper heat pipes and/or a copper heat transfer element that are made of dissimilar metal materials, and to directly weld the aluminum base to the first aluminum fin assembly that are made of the same metal material, without the need of any electroless nickel plating. In this way, it is able to effectively reduce the manufacturing cost of the thermal module and to ensure environmental protection.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 2B is a sectional view taken along the cutting plane phantom line in FIG. 2A.

DETAILED DESCRIPTION OF THE PREFERRED EMBODIMENTS

Figure 1A:
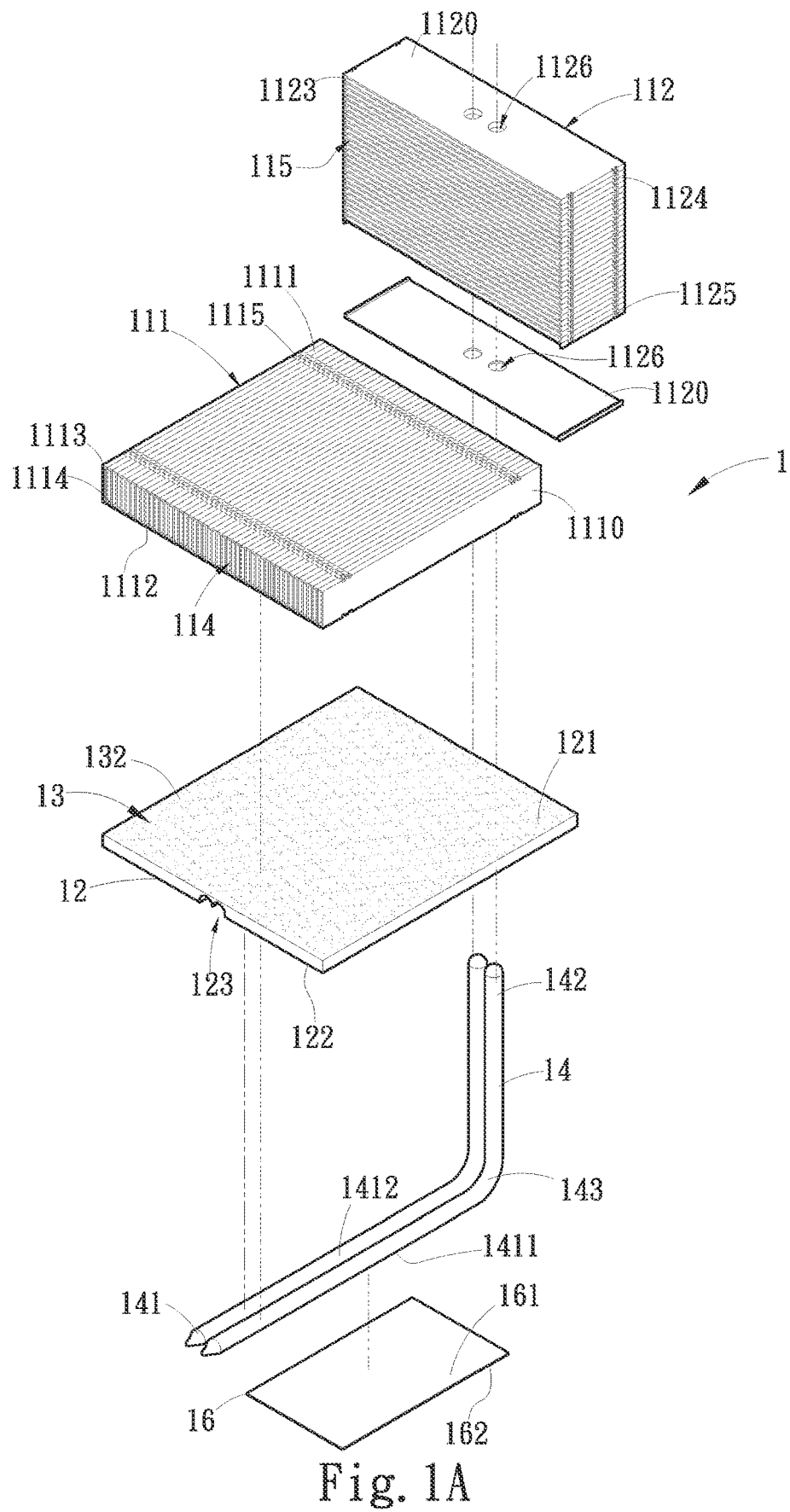
FIG. 1A is an exploded top perspective view of a thermal module structure according to a preferred embodiment of the present invention.

The present invention will now be described with a preferred embodiment thereof.

Please refer to FIGS. 1A, 1B, 2A and 2B. The present invention provides a thermal module structure 1, which includes an aluminum base 12, at least one copper heat pipe 14, at least one copper heat transfer element 16, a first aluminum fin assembly 111, and a second aluminum fin assembly 112. The first aluminum fin assembly 111 may be directly formed on an upper surface 121 of the aluminum base 12. However, in the illustrated preferred embodiment of the present invention, the first aluminum fin assembly 111 is formed of a plurality of first fins 1110 that are sequentially fastened to one another in a horizontal direction. The second aluminum fin assembly 112 is formed of a plurality of second fins 1120 that are sequentially fastened to one another in a vertical direction. Each of the first fins 1110 includes a first bent edge 1113 and a second bent edge 1114, which are sideward projected from an upper and a lower end of the first fin 1110, respectively, to align with the first and the second bent edge 1113, 1114 of another adjacent first fin 1110. Further, the first and the second bent edge 1113, 1114 are respectively provided with a fastening section 1115. Similarly, each of the second fins 1120 includes a first bent edge 1123 and a second bent edge 1124, which are downward projected from a left and a right end of the second fin 1120, respectively, to align with the first and the second bent edge 1123, 1124 of another adjacent second fin 1120. Further, the first and the second bent edge 1123, 1124 are respectively provided with a fastening section 1125. In the illustrated preferred embodiment, the fastening sections 1115, 1125 on the first and the second fins 1110, 1120, respectively, are snap-fit structures. However, it is understood the illustration is non-restrictive and other known technical means for fastening may also be adopted.

Every first fin 1110 and its adjacent first fin 1110 are horizontally fastened, snap fitted or lap joined together via engagement of their fastening sections 1115 with each other. The first aluminum fin assembly 111 is formed by the first fins 1110 connected together in the above-described manner, such that the first bent edges 1113 and the second bent edges 1114 of the first fins 1110 form a top surface 1111 and a bottom surface 1112, respectively, of the first aluminum fin assembly 111. With the above arrangements, any two adjacent first fins 1110 on the first aluminum fin assembly 111 together define a first air flow passage 114 between them. When an external air flow passes through the first air flow passages 114, heat absorbed by the first fins 1110 is brought away by the air flow.

Similarly, every second fin 1120 and its adjacent second fin 1120 are vertically fastened, snap fitted or lap joined together via engagement of their fastening sections 1125 with each other. The second aluminum fin assembly 112 is formed by the second fins 1120 connected together in the above-described manner, such that the first bent edges 1123 and the second bent edges 1124 of the second fins 1120 form a left surface and a right surface, respectively, of the second aluminum fin assembly 112. Further, an uppermost and a lowermost second fin 1120 of the second aluminum fin assembly 112 form a top and a bottom of the second aluminum fin assembly 112, respectively. With the above arrangements, any two adjacent second fins 1120 on the second aluminum fin assembly 112 together define a second air flow passage 115 between them, so that air flows in a direction perpendicular to the first air flow passage 114 can flow through the second air flow passages 115. When an external air flow passes through the second air flow passages 115, heat absorbed by the second fines 1120 is brought away by the air flow. In some other operable embodiments, at least one fan (not shown), such as an axial fan, can be optionally provided for each of the first and the second aluminum fin assembly 111, 112 at one side corresponding to the first and the second air flow passages 114, 115 defined by the first fines 1110 and the second fins 1120, respectively. The fans can produce external air flows to enable forced cooling of the first fins 1110 and the second fins 1120.

Every second fin 1120 of the second aluminum fin assembly 112 is provided with at least one through hole 1126, which extends through the second fin 1120 in a thickness direction thereof. The through holes 1126 on the connected second fins 1120 are aligned with one another, allowing a heat dissipation section 142 of the copper heat pipe 14 to extend therethrough and associate therewith. The through holes 1126 respectively have a flange 1127, which is formed around the through hole 1126 to project from one side of the second fin 1120. In the illustrated preferred embodiment, the flanges 1127 are respectively projected from a lower side of the second fins 1120. And, each of the flanges 1127 defines a flange inner surface 1128. As can be seen in FIG. 1A, the first aluminum fin assembly 111 has an outermost first fin 1110 that is connected to its adjacent first fin 1110 inside out, and the second aluminum fin assembly 112 has an outermost second fin 1120 that is connected to its adjacent second 1120 upside down. In this way, there won't be any exposed first bent edge 1113, 1123 and second bent edge 1114, 1124 on the first and the second aluminum fin assembly 111, 112 that tend to scratch other parts or undesirably hurt any user.

The aluminum base 12 has an upper surface 121, a lower surface 122, and at least one receiving section 123. The upper surface 121 of the aluminum base 12 is connected to the bottom surface 1112 of the first aluminum fin assembly 111. Alternatively, the upper surface 121 of the aluminum base 12 can have a plurality of extruded aluminum fins integrally formed therewith to provide the first aluminum fin assembly 111. The first air flow passages 114 on the first aluminum fin assembly 111 are oriented perpendicular to the upper surface 121 of the aluminum base 12; and the second air flow passages 115 on the second aluminum fin assembly 112 are oriented parallel to the upper surface 121 of the aluminum base 12. As can be most clearly seen in FIG. 2A, a heat dissipation gap or space 1129 is formed between the upper surface 121 of the aluminum base 12 and the bottom of the second aluminum fin assembly 113. Alternatively, the second aluminum fin assembly 112 may be directly connected at its bottom to the upper surface 121 of the aluminum base 12.

The receiving section 123 can be a groove or a through bore and be selectively formed on the upper surface 121 or the lower surface 122 or between the upper and the lower surface 121, 122 of the aluminum base 12. In the illustrated preferred embodiment, the receiving section 123 is a groove formed on the lower surface 122 of the aluminum base 12. However, the illustration is non-restrictive, and the receiving section 123 can be a through bore formed on the aluminum base 12 between the upper and the lower surface 121, 122. The receiving section 123 of the aluminum base 12 is used to correspondingly receive a heat absorption section 141 of the copper heat pipe 14 therein. In practical implementation of the present invention, the receiving section 123 has a cross-sectional configuration matching that of the heat absorption section 141 of the copper heat pipe 14, such as a flat, a round or a D-shaped cross-sectional configuration.

Figure 1B:
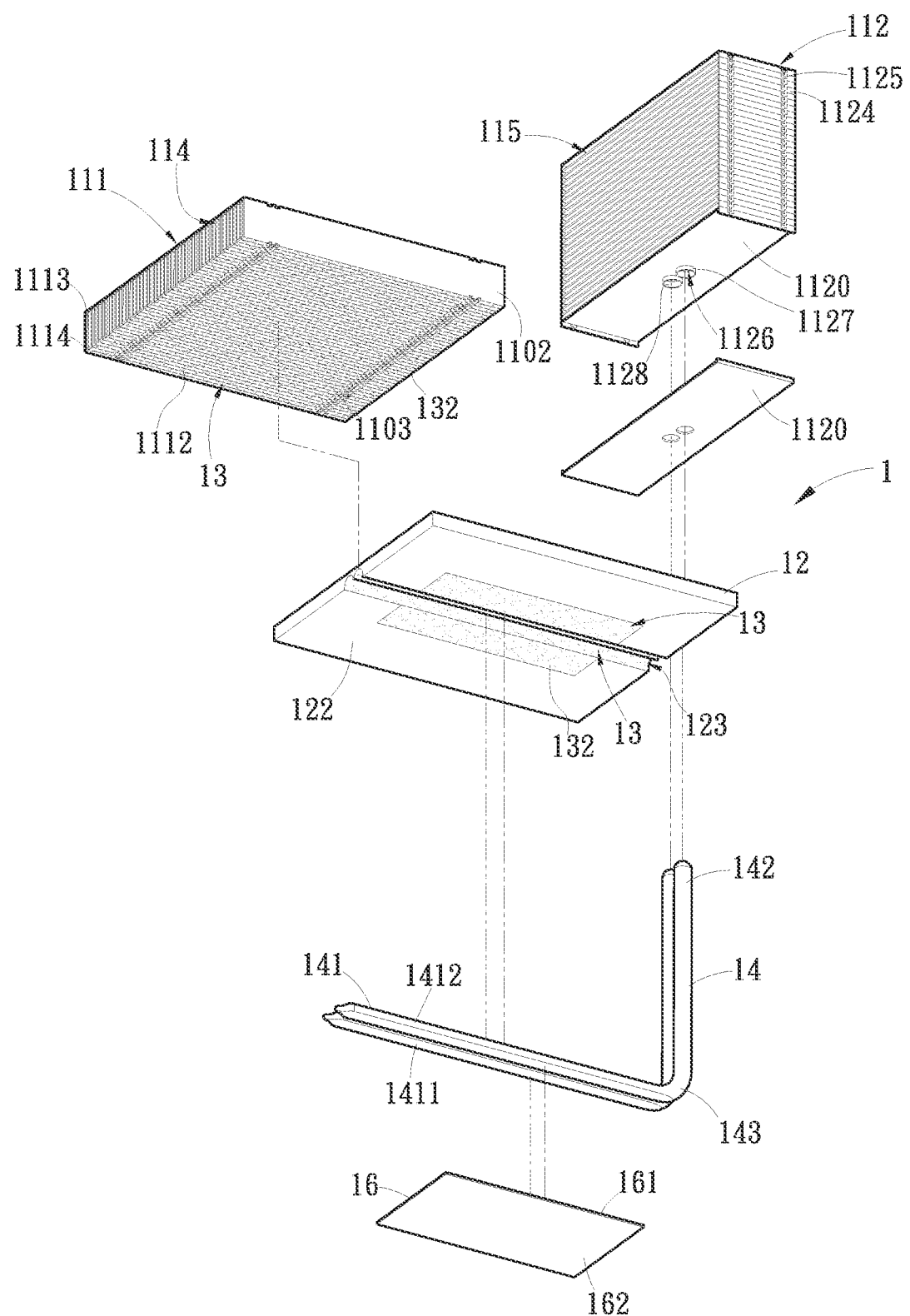
FIG. 1B is an exploded bottom perspective view of the thermal module structure according to the preferred embodiment of the present invention.
Figure 2A:
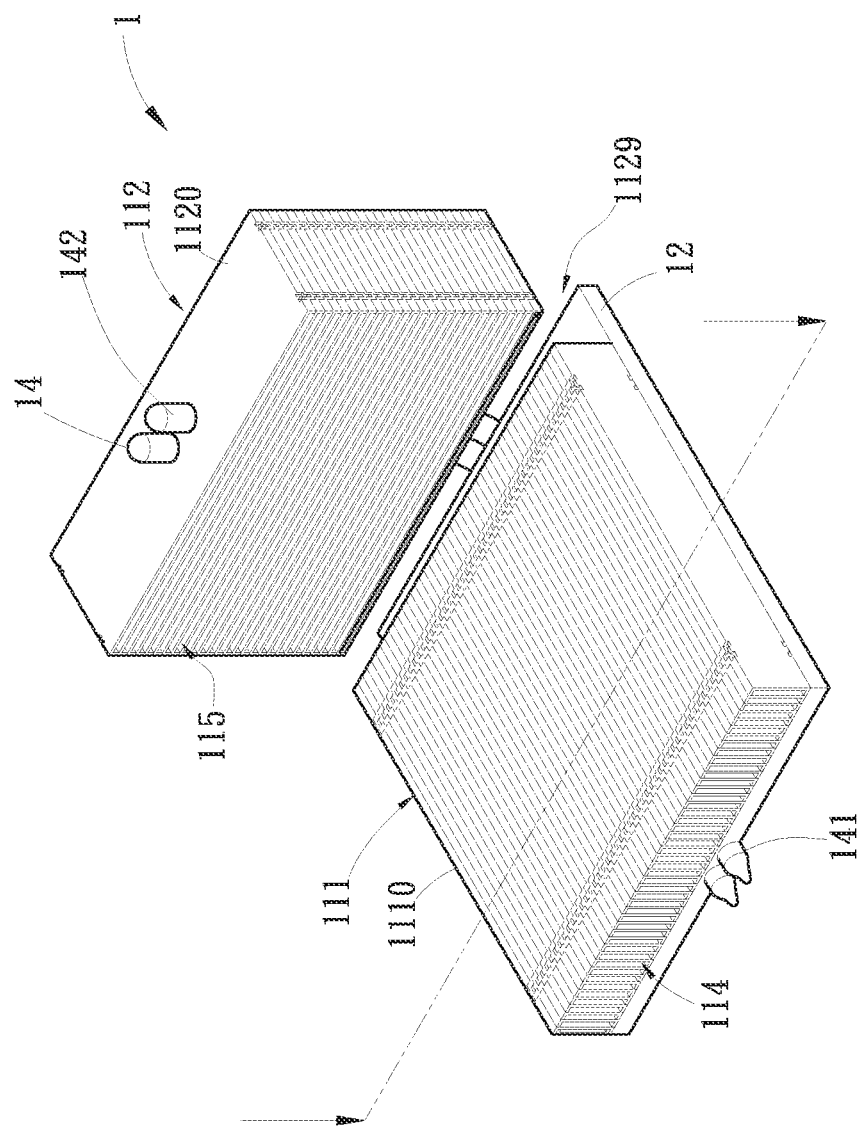
FIG. 2A is an assembled view of FIG. 1A.

Please refer to FIGS. 1A, 1B and 2B. Portions of the upper and the lower surface 121, 122 of the aluminum base 12 corresponding to the bottom surface 1112 of the first aluminum fin assembly 111 and the receiving section 123, respectively, are provided with a copper embedding layer 13 each. The copper embedding layer 13 includes a deepening surface 131 and a connecting surface 132. The connecting surface 132 is an exposed surface of the copper embedding layer 13 for connecting to the bottom surface 1112 of the first aluminum fin assembly 111, the upper and lower surfaces 121, 122 of the aluminum base 12, and the receiving section 123. The deepening surface 131 deeply penetrates into and bonds to the bottom surface 1112 of the first aluminum fin assembly 111, the upper and lower surfaces 121, 122 of the aluminum base 12, and the receiving section 123. The copper embedding layer 13 can be copper powder/granules, copper foil, copper sheet or liquid copper applied to the bottom surface 1112 of the first aluminum fin assembly 111, the upper and lower surfaces 121, 122 of the aluminum base 12, and the receiving section 123 through mechanical processing, such as pneumatic pressing, hydraulic pressing, stamping, oil pressing or extruding; or through surface finishing, such as spraying or printing; or through chemical processing, such as electroplating or anodizing. In the course of forming the copper embedding layer 13, a part of the copper embedding layer 13 would directly grip, be embedded or buried in, deeply penetrate into, or be deposited on the bottom surface 1112 of the first aluminum fin assembly 111, the upper and lower surfaces 121, 122 of the aluminum base 12, and the receiving section 123 to form the deepening surface 131. In this manner, the copper embedding layer 13 not only has a connecting surface 132 that is formed on the bottom surface 1112 of the first aluminum fin assembly 111, the upper and lower surfaces 121, 122 of the aluminum base 12, and the receiving section 123, but also a deepening surface 131 that directly grips, is embedded or buried in, deeply penetrates into, or is deposited on the bottom surface 1112 of the first aluminum fin assembly 111, the upper and lower surfaces 121, 122 of the aluminum base 12, and the receiving section 123 to serve as a foundation of the copper embedding layer 13 and provides the copper embedding layer 13 with an enhanced bond strength. Therefore, the copper embedding layer 13 is prevented from peeling or flaking off the bottom surface 1112 of the first aluminum fin assembly 111, the upper and lower surfaces 121, 122 of the aluminum base 12, and the receiving section 123. With these arrangements, the upper surface 121 and the lower surface 122 of the aluminum base 12 can be well connected to the bottom surface 1112 of the first aluminum fin assembly 111 and the copper heat transfer element 16, respectively, via the copper embedding layer 13; and the heat absorption section 141 of the copper heat pipe 14 can also be well connected to the copper embedding layer 13 in the receiving section 123 of the aluminum base 12 by welding, for example.

The copper heat pipe 14 is formed of a metal material different from that of the aluminum base 12 and the first aluminum fin assembly 111. Every copper heat pipe 14 internally defines a chamber 145, in which a working fluid, such as pure water is filled. The chamber 145 is provided on an inner wall surface thereof with a wick structure 144, such as sintered powder, grooves, a mesh structure, fibers, braided structures, or any combination thereof.

The copper heat pipe 14 includes a horizontally extended heat-absorption section 141, a vertically extended heat dissipation section 142, and a substantially right-angled intermediate section 143. The right-angled intermediate section 143 is connected at two ends to the heat absorption section 141 and the heat dissipation section 142, giving the copper heat pipe 14 a substantially L-shaped configuration. The heat absorption section 141 is fitted in the receiving section 123 formed on the aluminum base 12 for absorbing and transferring heat from a heat source to the heat dissipation section 142 remote from the heat source, and the heat is eventually dissipated into surrounding air from the second aluminum fin assembly 112. The heat absorption section 141 includes a contact surface 1411, which is flush with the lower surface 122 of the aluminum base 12; and a fitting surface 1412, which is welded to the copper embedding layer 13 at the receiving section 123. The heat dissipation section 142 is extended through the through holes 1126 of the second fins 1120 and is held to the flange inner surfaces 1128 of the flanges 1127 through tight fit. However, in another alternative embodiment, the heat dissipation section 142 of the copper heat pipe 14 and the flanges 1127 of the through holes 1126 are loosely fitted with one another, and the flange inner surfaces 1128 are respectively provided with the copper embedding layer 13 for connecting to the heat dissipation section 142 of the copper heat pipe 14 by welding, for example.

In the illustrated drawings, the heat dissipation section 142 of the copper heat pipe 14 has a round cross section, and the heat absorption section 141 of the copper heat pipe 14 has a D-shaped cross section with a flat contact surface 1411 flash with the lower surface 122 of the aluminum base 12. However, the above illustration is non-restrictive. In other alternative embodiments, both of the heat absorption section 141 and the heat dissipation section 142 can have a round, a flat, or a D-shaped cross section.

Please refer to FIGS. 1B and 2B. The copper heat transfer element 16 is a copper member, such as a copper plate. In the illustrated preferred embodiment, the copper heat transfer element 16 is made of a metal material different that of the aluminum base 12 but the same as that of the copper heat pipe 14. The copper heat transfer element 16 includes a heat transferring side 161 and a heat absorbing side 162. The heat transferring side 161 is connected to the copper embedding layer 13 provided on the lower surface 122 of the aluminum base 12 and the contact surface 1411 of the copper heat pipe 14 by welding, for example.

The heat absorbing side 162 of the copper heat transfer element 16 is in contact with a heat producing element, such as a central processing unit (CPU) or a graphics processing unit (GPU) (not shown), for absorbing heat produced by the heat producing element and transferring the absorbed heat to the heat transferring side 161. Then, the contact surface 1411 of the heat absorption section 141 of the copper heat pipe 14 absorbs heat from the heat transferring side 161 and transfers the heat to the remote heat dissipation section 142, from where the heat is dissipated into surrounding air via the second aluminum fin assembly 112.

Meanwhile, a part of the heat on the heat transferring side 161 is absorbed by the copper embedding layer 13 at the lower surface 122 of the aluminum base 12 and finally dissipated into surrounding air via the aluminum base 12 and the first aluminum fin assembly 111 through heat exchange.

In the present invention, with the provision of the copper embedding layers 13 on the aluminum base 12 and the first aluminum fin assembly 111 at areas that are to be connected with one another, it is possible to directly weld the aluminum base 12 to the copper heat pipe 14 and/or the copper heat transfer element 16, which is made of a metal material different from that of the aluminum base 12, and to the first aluminum fin assembly 111, which is made of a metal material the same as that of the aluminum base 12, without the need of any electroless nickel plating. In this way, it is able to effectively reduce manufacturing cost, ensure environmental protection, and solve the problem of material shortage of nickel and phosphorus.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A thermal module structure, comprising:
an aluminum base having an upper surface, a lower surface, and at least one receiving section;
at least one copper heat pipe including a horizontally extended heat absorption section, a vertically extended heat dissipation section, and a substantially right-angled intermediate section; the intermediate section being connected at two ends to the heat absorption section and the heat dissipation section to give the copper heat pipe a substantially L-shaped configuration; and the heat absorption section being fitted in the receiving section of the aluminum base;
a first aluminum fin assembly including a plurality of first fins provided on the upper surface of the aluminum base; any two adjacent first fins together defining a first air flow passage between them, and the first air flow passages being oriented perpendicular to the upper surface of the aluminum base;
a second aluminum fin assembly including a plurality of second fins that are sequentially fastened to one another; every second fin being provided with at least one through hole to extend through the second fin in a thickness direction thereof for the heat dissipation section of the copper heat pipe to extend therethrough; any two adjacent second fins together defining a second air flow passage between them; and the second air flow passages being oriented parallel to the upper surface of the aluminum base to allow air flows in a direction perpendicular to the first air flow passage to flow through the second air flow passages; and at least one copper embedding layer being formed on the upper surface and the receiving section of the aluminum base and on a bottom surface of the first aluminum fin assembly; the upper surface of the aluminum base and the bottom surface of the first aluminum fin assembly being connected to each other via the copper embedding layers, and the receiving section on the aluminum base and the heat absorption section of the copper heat pipe also being connected to one another via the copper embedding layer.

2. The thermal module structure as claimed in claim 1, wherein the receiving section is in the form of a groove located at the lower surface of the aluminum base.

3. The thermal module structure as claimed in claim 1, further comprising a copper heat transfer element having a heat transferring side and a copper embedding layer formed on the lower surface of the aluminum base; and the lower surface of the aluminum base being connected to the heat transferring side of the copper heat transfer element via the copper embedding layer.

4. The thermal module structure as claimed in claim 1, wherein the copper embedding layers are formed on the bottom surface of the first aluminum fin assembly, the upper surface of the aluminum base, and the receiving section in a manner selected from the group consisting of mechanical processing, surface finishing, and chemical processing.

5. The thermal module structure as claimed in claim 1, wherein the copper embedding layer includes a deepening surface and a connecting surface; the connecting surface being formed on the bottom surface of the first aluminum fin assembly, the upper surface of the aluminum base, and the receiving section; and the deepening surface deeply penetrating into the bottom surface of the first aluminum fin assembly, the upper surface of the aluminum base, and the receiving section.

6. The thermal module structure as claimed in claim 1, wherein the through holes on the second fins respectively have a flange, which is projected from one side of the second fin to define a flange inner surface.

7. The thermal module structure as claimed in claim 1, wherein the first fins are sequentially fastened to one another to form the first aluminum fin assembly on the upper surface of the aluminum base.

\* \* \* \* \*